(12) United States Patent
Welchko et al.

(10) Patent No.: US 7,471,526 B2
(45) Date of Patent: Dec. 30, 2008

(54) METHOD AND APPARATUS TO REDUCE PWM VOLTAGE DISTORTION IN ELECTRIC DRIVES

(75) Inventors: Brian A Welchko, Torrance, CA (US); Bonho Bae, Torrance, CA (US); Steven E. Schulz, Torrance, CA (US); Silva Hiti, Redondo Beach, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 144 days.

(21) Appl. No.: 11/676,574

(22) Filed: Feb. 20, 2007

(65) Prior Publication Data

US 2008/0197902 A1   Aug. 21, 2008

(51) Int. Cl.
*H02M 7/537* (2006.01)
*H02P 23/00* (2006.01)

(52) U.S. Cl. .................... 363/41; 363/131; 318/599; 318/811

(58) Field of Classification Search .................... 363/40, 363/41, 42, 43, 97, 98, 131, 132; 318/599, 318/629, 801, 811
See application file for complete search history.

(56) References Cited

U.S. PATENT DOCUMENTS

| 5,450,306 | A | * | 9/1995 | Garces et al. | 363/41 |
|---|---|---|---|---|---|
| 6,023,417 | A | * | 2/2000 | Hava et al. | 363/41 |
| 6,075,350 | A | * | 6/2000 | Peng | 323/207 |
| 7,307,401 | B2 | * | 12/2007 | Gataric et al. | 318/807 |
| 7,391,181 | B2 | * | 6/2008 | Welchko et al. | 318/811 |
| 7,411,801 | B2 | * | 8/2008 | Welchko et al. | 363/131 |

* cited by examiner

*Primary Examiner*—Gary L Laxton

(57) ABSTRACT

Methods and apparatus are provided for reducing voltage distortion effects at low speed operation in electric drives. The method comprises receiving a first signal having a duty cycle with a range between minimum and maximum achievable duty cycles, producing a second duty cycle based on the minimum achievable duty cycle if the duty cycle is within a distortion range and less than a first clipping value, producing a second duty cycle based on the closer of minimum and maximum pulse widths if the duty cycle is within the distortion range and between the first and a second clipping value, producing a second duty cycle based on the maximum achievable duty cycle if the duty cycle is within the distortion range and greater than the second clipping value, and transmitting a second signal to the voltage source inverter having the second duty cycle.

20 Claims, 3 Drawing Sheets

METHOD AND APPARATUS TO REDUCE PWM VOLTAGE DISTORTION IN ELECTRIC DRIVES

TECHNICAL FIELD

The present invention generally relates to voltage source inverters, and more particularly relates to apparatus and methods for controlling the output voltage component of a voltage source inverter in electric motors.

BACKGROUND OF THE INVENTION

An inverter controller may be used to control, among other things, a vehicle traction drive. In such cases, Discontinuous Pulse Width Modulation (DPWM) methods are commonly employed to control the fundamental output voltage component of voltage source inverters. For example, DPWM methods may be used to control the switching action of three-phase voltage source inverter. These three-phase voltage source inverters may in turn be used to control the phase currents of three-phase alternating current (AC) motors in electric drives.

Ideally, the switch pairs in each phase leg of the three-phase voltage source inverter each operate in a complimentary fashion such that one switch is always "on" and the other switch is always "off." In practice, however, the switches are not ideal, and a blanking time, or dead-time, is typically inserted during each transition of a switching state of the voltage source inverter. The dead-time is a short interval during which both switches are gated "off." This prevents both switches in a phase leg of the voltage source inverter from simultaneously being "on," which could short-circuit the voltage source inverter.

Additionally, the gate drive circuitry may have limitations or the switches may impose limitations on the minimum "on" time duration that is commanded (e.g., directed by a control module, processor, or the like) to a switch in the voltage source inverter. The minimum pulse width limitations and dead-time limitations together result in finite minimum (e.g., non-zero) and maximum (e.g., non-unity) values of duty cycle which can be commanded by the controller (e.g., a DPWM modulator).

Conventional DPWM methods typically switch two phases of the inverter during any given switching cycle with the remaining phase having one switch continuously "on." When the controlled output voltage is small, such as during low speed operation of the electric drive, the two phases that are switching are often required to produce output duty cycles that are very small or very large. As a result, the presence of maximum and minimum achievable output duty cycles impacts the accuracy of the output voltage.

Accordingly, it is desirable to provide a voltage source inverter controller that improves the accuracy of the output voltage. In addition, it is desirable to provide a method for controlling a voltage source inverter that improves the accuracy of the output voltage of the voltage source inverter. Furthermore, other desirable features and characteristics of the present invention will become apparent from the subsequent detailed description and the appended claims, taken in conjunction with the accompanying drawings and the foregoing technical field and background.

SUMMARY OF THE INVENTION

Methods and apparatus are provided for controlling a voltage source inverter that reduces voltage distortion effects in electric drives. In an exemplary embodiment, a method for controlling a voltage source inverter is provided. The voltage source inverter has minimum and maximum pulse widths (e.g., $d_{min}$ and $d_{max}$) and an output voltage distortion range outside of the minimum and maximum pulse widths. The method comprises receiving a first signal having a duty cycle, producing a second signal if the duty cycle of the first signal is within the output voltage distortion range and less than a first clipping value (e.g., $d_{clipLower}$), producing a third signal if the duty cycle of the first signal is within the output voltage distortion range and one of the duty cycle of the first signal is greater or equal to the first clipping value and the duty cycle of the first signal is less than or equal to a second clipping value (e.g., $d_{clipUpper}$), producing a fourth signal if the duty cycle of the first signal is within the output voltage distortion range and greater than a second clipping value, and transmitting one of the second, third, and fourth signals to the voltage source inverter. The duty cycle has a range from the minimum achievable duty cycle to the maximum achievable duty cycle. The second signal has the minimum achievable duty cycle, the third signal has a closer one of the minimum and maximum pulse widths to the duty cycle of the first signal, and the fourth signal has the maximum achievable duty cycle. The second clipping value is greater than the first clipping value.

In another exemplary embodiment, a method is provided for controlling a voltage source inverter having minimum and maximum pulse widths, a first distortion range less than the minimum pulse width, and a second distortion range greater than the maximum pulse width. The method comprises receiving a first signal having a duty cycle, producing a first modified duty cycle configured to maintain a first average output voltage in the first distortion range if the duty cycle of the first signal is within the first distortion range, producing a second modified duty cycle configured to maintain a second average output voltage in the second distortion range if the duty cycle of the first signal is within the second distortion range, and supplying a second signal to the voltage source inverter, wherein the second signal comprises one of the first and second modified duty cycles.

In another exemplary embodiment, a voltage source inverter for controlling an alternating current (AC) motor is provided. The voltage source inverter has a distortion range and comprises a controller having an input and an output, a modulator having an input coupled to the output of the controller and having an output, and a switch network having an input coupled to the output of the modulator and having an output configured to couple to the AC motor. The controller is configured to produce a first signal having a first duty cycle. The modulator is configured to produce a second duty cycle configured to maintain an average output voltage of the voltage source inverter if the first duty cycle is in the distortion range, and produce a second signal having the second duty cycle. The switch network is configured to produce an output voltage to the AC motor in response to the second signal.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
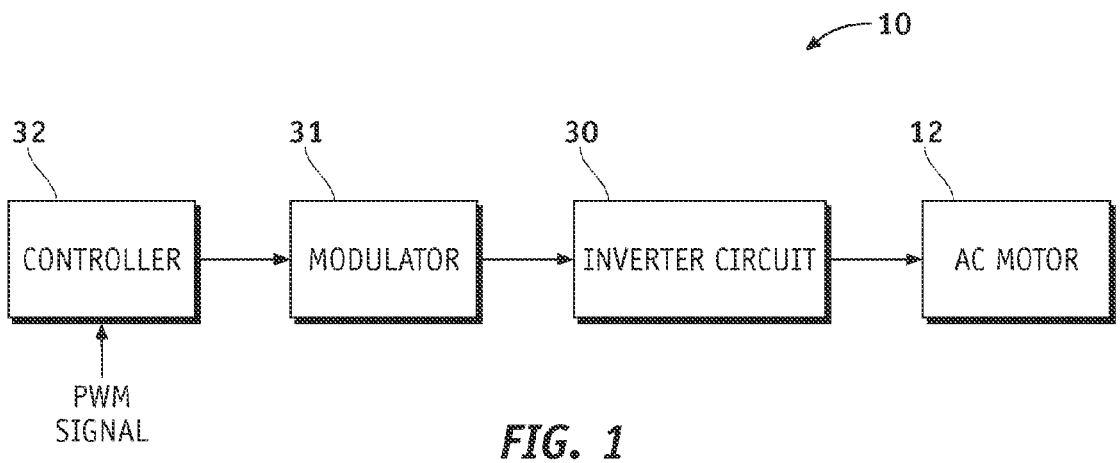
FIG. 1 is a block diagram of a voltage source inverter system in accordance with an exemplary embodiment of the present invention.

Referring to FIG. 1, a voltage source inverter system 10 is shown in accordance with an exemplary embodiment of the present invention. The voltage source inverter system 10 comprises a controller 32, a modulator 31 having an input coupled to an output of the controller 32, an inverter circuit 30 having an input coupled to an output of the modulator 31, and an alternating current (AC) motor 12 coupled to an output of the inverter circuit 30. Although the controller 32 and modulator 31 are shown and described as separate components of the voltage source inverter system 10, the controller 32 and modulator 31 may be combined into a single unit (e.g., the modulator 31 may be a sub-circuit within the controller 32 and vice versa).

Generally, the controller 32 produces a pulse width modulation (PWM) signal for controlling the switching action of the inverter circuit 30. The controller 32 may also receive a signal (e.g., another PWM signal) and produce the signal to control the inverter circuit 30 therefrom. In a preferred embodiment, the controller 32 produces a discontinuous PWM (DPWM) signal having a duty cycle. The duty cycle has a range from a minimum achievable duty cycle (e.g., a discrete zero) to a maximum achievable duty cycle (e.g., a discrete one), or from rail-to-rail. In this embodiment, the modulator 31 modifies the signal from the controller 32 if the duty cycle of the signal is in an output voltage distortion range. The result of this modification reduces the distortion effects on the AC motor 12, particularly at low speed operation.

The PWM signal from the controller has minimum and maximum pulse width limitations due to hardware limitations and dead-time limitations (e.g., to prevent short-circuiting of the inverter circuit 30). Outside of the minimum and maximum pulse widths is the output voltage distortion range. At low speeds, when employing DPWM methods, the switching phases of the inverter circuit 30 are producing very small or very large duty cycles which are normally not achievable due to the hardware limitations, and thus the omission of the small or large pulses distorts the commanded output voltage (e.g., a lower output voltage distortion range associated with the small pulses and a higher output voltage distortion range associated with the large pulses). To reduce the effect of these distortions, the duty cycle is modified by the modulator 31.

In one embodiment, the effect of these distortions is reduced by maintaining an average output voltage in the distortion region. To maintain an average output voltage in the lower output voltage distortion range (e.g., between the minimum achievable duty cycle and the minimum pulse width), the duty cycle may be modified such that output voltage associated with the minimum pulse width is produced during one half of the lower output voltage distortion range. Similarly, to maintain an average output voltage in the upper output voltage distortion range (e.g., between the maximum pulse width and the maximum achievable duty cycle), the duty cycle may be modified such that output voltage associated with the maximum pulse width is produced during one half of the upper output voltage distortion range.

Upper and lower clipping values may be used to indicate when to modify the duty cycle and when the duty cycle is in the output voltage distortion range. For example, in one embodiment, the duty cycle is modified to the minimum achievable duty cycle (discrete zero) if the duty cycle is less than the lower clipping value; the duty cycle is modified to the minimum pulse width if the duty cycle is greater than or equal to the lower clipping value; the duty cycle is modified to the maximum pulse width if the duty cycle is greater than the maximum pulse width; and the duty cycle is modified to the maximum achievable duty cycle if the duty cycle is greater than the upper clipping value. In one embodiment, the lower and upper clipping values are selected as the mid-points of the respective distortion ranges (e.g., lower and upper output voltage distortion ranges) although the clipping values may be selected at any point between the respective distortion ranges. For example, the lower clipping value is selected as the mid-point between the minimum achievable duty cycle and the minimum pulse width, and the upper clipping value is selected as the mid-point between the maximum pulse width and the maximum achievable duty cycle. If the duty cycle is outside of the distortion range, the duty cycle is not modified to reduce distortion effects and is retained in the signal supplied to the inverter circuit 30.

The inverter circuit 30 receives the signal from the modulator 31 and converts this signal to a modulated voltage waveform for operating the AC motor 12. The AC motor 12 may be any conventional AC motor commonly used in automotive vehicles in a number of vehicle systems or subsystems. It will be appreciated that embodiments of the invention described herein may comprise one or more conventional processors and stored program instructions that control the one or more processors to implement, in conjunction with certain non-processor circuits (e.g., switching circuits), some, most, or all of the functions for controlling/modifying signals supplied to the inverter circuit 30 as described herein. As such, these functions may be interpreted as steps of a method for controlling a voltage source inverter. Alternatively, some or all functions could be implemented by a state machine that has no stored program instructions, or in one or more application specific integrated circuits (ASICs), in which each function or some combinations of certain of the functions are implemented as custom logic. Additionally, a combination of the two approaches could be used.

Figure 2:
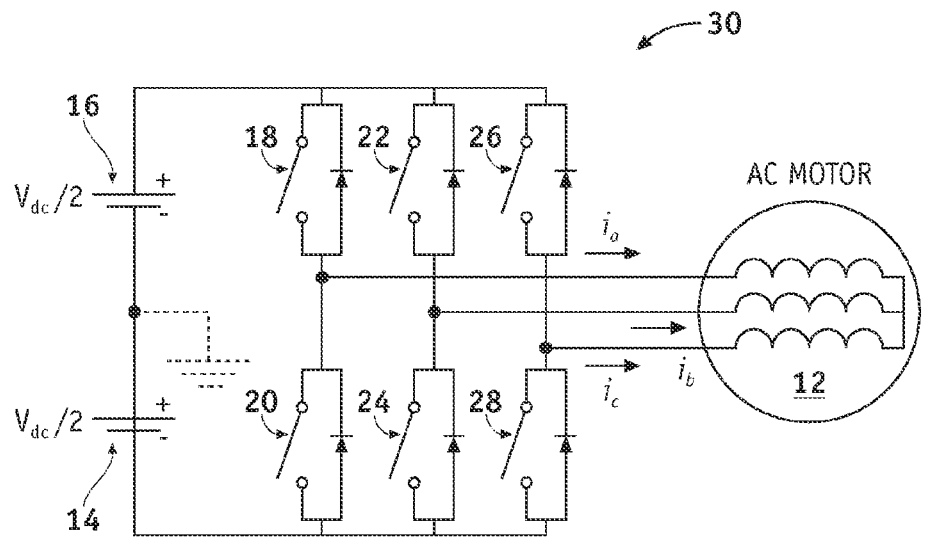
FIG. 2. is a circuit diagram of the inverter circuit shown in FIG. 1.

FIG. 2 is a circuit diagram of the inverter circuit shown in FIG. 1. The inverter circuit 30 is a three-phase circuit coupled to the AC motor 12. More specifically, the inverter circuit 30 comprises voltage source 14, 16 and a switch network having a first input coupled to the voltage source 14, 16 and an output configured to be coupled to the AC motor 12. Although the voltage source 14, 16 is shown as a distributed direct current (DC) link with two series sources (e.g., a first series source 14 and a second series source 16), a single voltage source may be used.

The switch network comprises three pairs of series switches with antiparallel diodes (i.e., antiparallel to each switch) corresponding to each of the phases. Each of the pairs of series switches comprises a first switch 18, 22, and 26 having a first terminal coupled to a positive electrode of the voltage source 14, 16 and a second switch 20, 24, and 28 having a first terminal coupled to a negative electrode of the voltage source 14, 16 and having a second terminal coupled to a second terminal of the first switch 18, 22, and 26, respectively. Although not shown, the modulator 31 (FIG. 1) may also monitor the switching cycle and the output voltage of the inverter circuit 30 (e.g., for additional modulation techniques).

Figure 3:
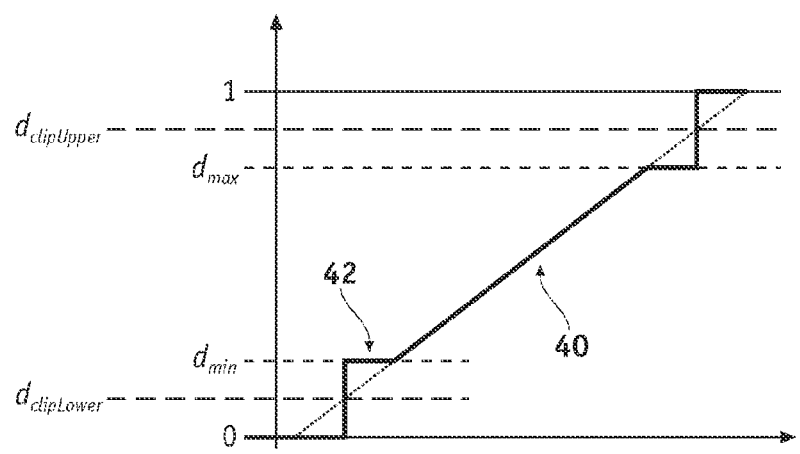
FIG. 3 is a waveform illustrating the relation between phase duty cycle and pulse width useful in understanding the voltage source inverter system shown in FIG. 1.

FIG. 3 is a waveform 42 illustrating the relation between phase duty cycle and pulse width useful in understanding the voltage source inverter system shown in FIG. 1. An ideal duty cycle 40 and a duty cycle 42 modified in accordance with one embodiment are shown. The minimum and maximum pulse widths ($d_{min}$, $d_{max}$) delineate a boundary for the output voltage distortion range. For example, the output voltage distortion range is below the minimum pulse width ($d_{min}$) and above the maximum pulse width ($d_{max}$) and limited by the minimum achievable duty cycle (e.g., discrete zero) and the maximum achievable duty cycle (e.g., discrete one), respectively. In this embodiment, the lower clipping value ($d_{clipLower}$) is the mid-point between the minimum achievable duty cycle (discrete zero (0)) and the minimum pulse width ($d_{min}$), and the upper clipping value ($d_{clipUpper}$) is the mid-point between the maximum pulse width ($d_{max}$) and the maximum achievable duty cycle (discrete one (1)).

Figure 4:
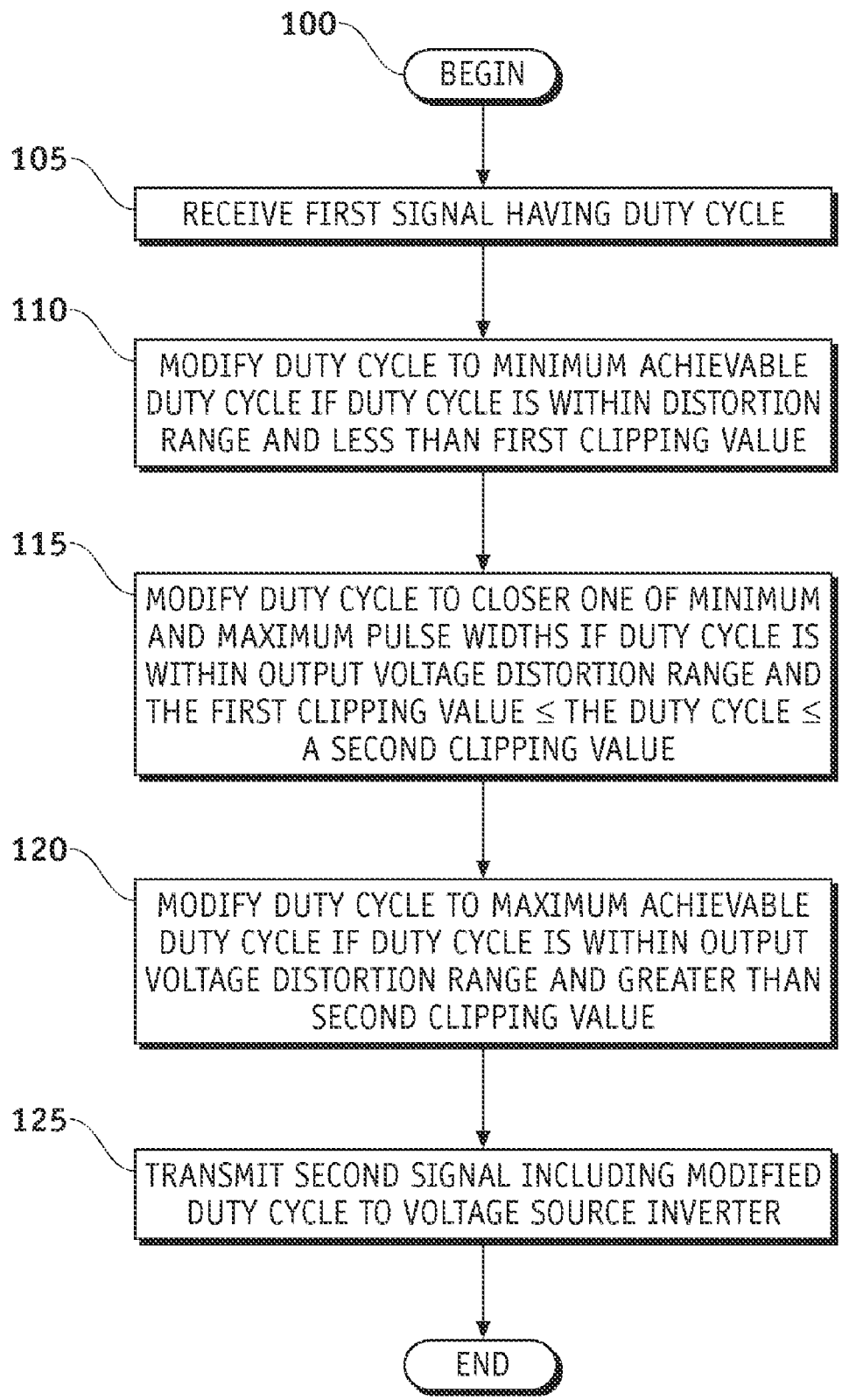
FIG. 4 is a flow diagram of a method for controlling a voltage source inverter in accordance with an exemplary embodiment of the present invention.

FIG. 4 is flow diagram of a method 100 for controlling a voltage source inverter in accordance with an exemplary embodiment of the present invention. Referring to FIGS. 1 and 4, the voltage source inverter has an output voltage distortion range. For example, the output voltage distortion range is between a minimum achievable duty cycle (e.g., a discrete zero) and a minimum pulse width (e.g., ($d_{min}$) and between a maximum pulse width (e.g., $d_{max}$) and a maximum achievable duty cycle (e.g., a discrete one). A first signal having a duty cycle is received, as indicated at step 105. For example, the modulator 31 receives a PWM signal from the controller 32. The duty cycle has a range from the minimum achievable duty cycle (e.g., a discrete zero) to the maximum achievable duty cycle (e.g., a discrete one).

The duty cycle is modified to the minimum achievable duty cycle (e.g., discrete zero) if the duty cycle is within the output voltage distortion range and less than a first clipping value (e.g., $d_{clipLower}$), as indicated at step 110. The duty cycle is modified to a closer one of the minimum and maximum pulse widths if: the duty cycle is within the output voltage distortion range; the duty cycle is greater than or equal to the first clipping value; and, the duty cycle is less than or equal to a second clipping value, as indicated at step 115. The second clipping value (e.g., $d_{clipUpper}$) is greater than the first clipping value (e.g., $d_{clipLower}$). In one embodiment, the duty cycle is modified to the minimum pulse width if the duty cycle is within the output voltage distortion range and greater than or equal to the first clipping value, and the duty cycle is modified to the maximum pulse width if the duty cycle is within the output voltage distortion range and less than or equal to the second clipping value. The first clipping value may be selected to be about a mid-point between the minimum achievable duty cycle and the minimum pulse width, and the second clipping value may be selected to be about a mid-point between the maximum achievable duty cycle and the maximum pulse width.

The duty cycle is modified to the maximum achievable duty cycle if the duty cycle is within the output voltage distortion range and greater than the second clipping value, as indicated at step 120. A second signal is transmitted (e.g., by the modulator 31) to the voltage source inverter, as indicated at step 125. The second signal comprises the duty cycle (e.g., modified or unmodified based on the preceeding steps). For example, the duty cycle of the first signal is retained in the second signal if the duty cycle is outside of the output voltage distortion range. In one embodiment, the first and second signals are DPWM signals for controlling the switch network of the inverter circuit 30.

The voltage source inverter has a first average output voltage associated with the output voltage distortion range (e.g., between the minimum achievable duty cycle and the minimum pulse width). Additionally, the voltage source inverter has a second average output voltage associated with the output voltage distortion range (e.g., between the maximum pulse width and the maximum achievable duty cycle). In this embodiment, the first average output voltage is maintained if the duty cycle is greater than or equal to the minimum achievable duty cycle and the duty cycle is less than the minimum pulse width. Additionally, the second average output voltage is maintained if the duty cycle is greater than the maximum pulse width and the duty cycle us less than or equal to the maximum achievable duty cycle. The voltage source inverter may comprise a switching circuit (e.g., the switch network of the inverter circuit 30), and the minimum and maximum pulse widths are based on preventing a short-circuit of the switching circuit.

Figure 5:
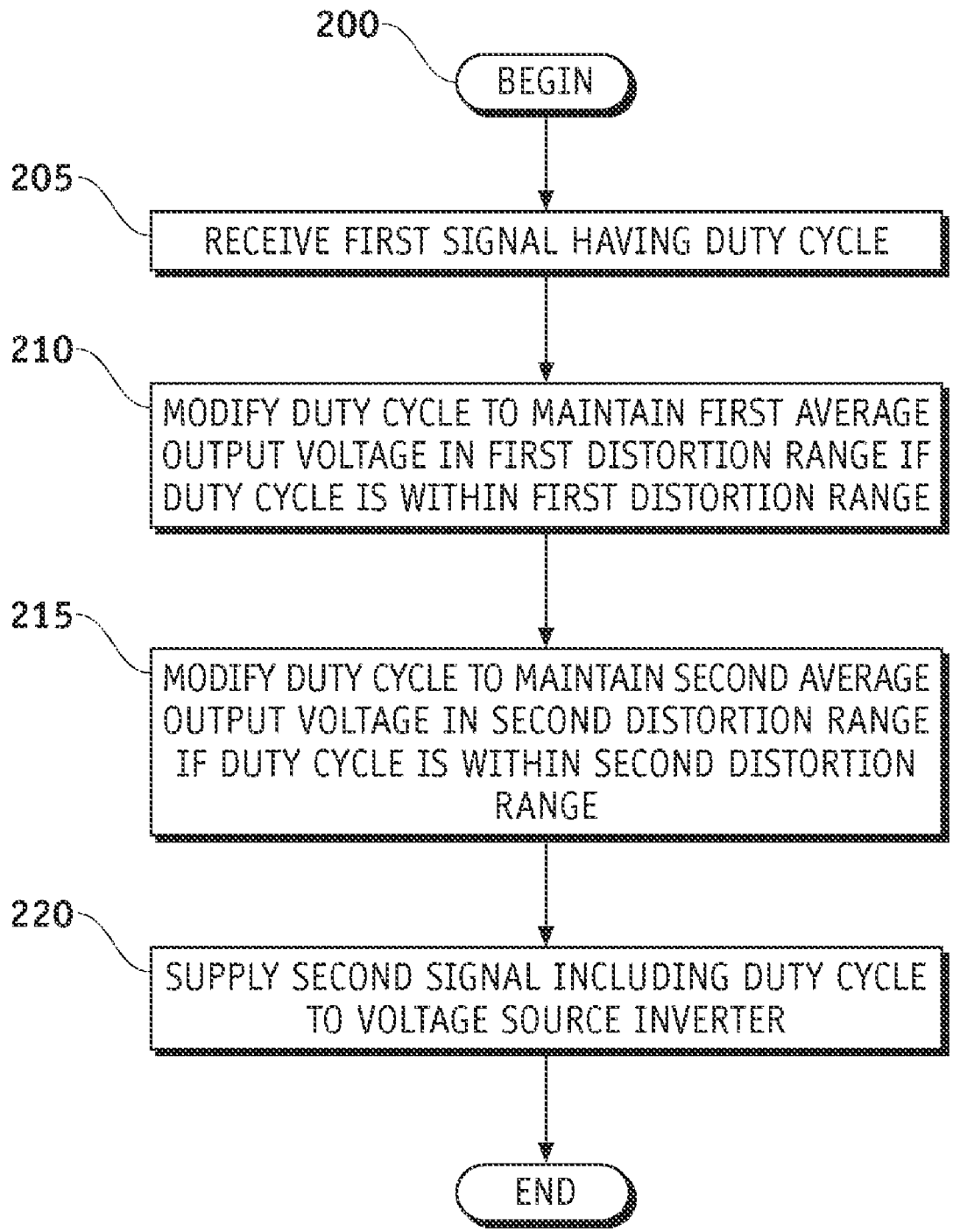
FIG. 5 is a flow diagram of a method for controlling a voltage source inverter in accordance with another exemplary embodiment of the present invention.

FIG. 5 is a flow diagram of a method 200 for controlling a voltage source inverter in accordance with another exemplary embodiment of the present invention. Referring to FIGS. 1 and 5, a first signal is received (e.g., by the modulator 31) having a duty cycle, as indicated at step 205. The duty cycle has a range from the minimum achievable duty cycle (e.g., discrete zero) to the maximum achievable duty cycle (e.g., discrete one). The duty cycle is modified to maintain a first average output voltage in the first distortion range if the duty cycle is within the first distortion range, as indicated at step 210. In one embodiment, the duty cycle is modified to the minimum achievable duty cycle if the duty cycle is within the first distortion range and less than a clipping value (e.g., $d_{clipLower}$) within the first distortion range, and the duty cycle is modified to the minimum duty cycle if the duty cycle is within the first distortion range and greater than or equal to the clipping value. The clipping value (e.g., $d_{clipLower}$) may be selected to be about a mid-point between the minimum achievable duty cycle and the minimum pulse width. In another embodiment, the duty cycle is modified to the minimum achievable duty cycle if the duty cycle is greater than or equal to the minimum achievable duty cycle and the duty cycle is less than the clipping value, and the duty cycle is modified to the minimum pulse width if the duty cycle is greater than or equal to the clipping value and the duty cycle is less than the minimum pulse width.

The duty cycle is modified to maintain a second average output voltage in the second distortion range if the duty cycle is within the second distortion range, as indicated at step 215. In one embodiment, the duty cycle is modified to the maximum pulse width if the duty cycle is within the second distortion range and less than or equal to a clipping value (e.g., $d_{clipUpper}$) within the second distortion range, and the duty cycle is modified to the maximum achievable duty cycle if the duty cycle is within the second distortion range and greater than the clipping value. In another embodiment, the duty cycle is modified to the maximum pulse width if the duty cycle is greater than the maximum pulse width and the duty cycle is less than the clipping value, and the duty cycle is modified to the maximum achievable duty cycle if the duty cycle is greater than the clipping value and the duty cycle less than or equal to the maximum achievable duty cycle.

A second signal is supplied to the voltage source inverter, as indicated at step 220. The second signal comprises the duty cycle. For example, the duty cycle of the first signal is retained in the second signal if the duty cycle is outside of the first distortion range and outside of the second distortion range (e.g., between $d_{min}$ and $d_{max}$).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for controlling a voltage source inverter, the voltage source inverter having minimum and maximum pulse widths, and an output voltage distortion range outside of the minimum and maximum pulse widths, the method comprising:

receiving a first signal having a duty cycle, the duty cycle having a range from a minimum achievable duty cycle to a maximum achievable duty cycle;

producing a second signal if the duty cycle of the first signal is within the output voltage distortion range and less than a first clipping value, the second signal having the minimum achievable duty cycle;

producing a third signal if the duty cycle of the first signal is within the output voltage distortion range and one of the duty cycle of the first signal is greater than or equal to a first clipping value or the duty cycle of the first signal is less than or equal to a second clipping value, the third signal having a closer one of the minimum and maximum pulse widths to the duty cycle of the first signal, the second clipping value greater than the first clipping value;

producing a fourth signal if the duty cycle of the first signal is within the output voltage distortion range and greater than the second clipping value, the fourth signal having the maximum achievable duty cycle; and transmitting one of the second, third, and fourth signals to the voltage source inverter.

2. A method according to claim 1, wherein said step of producing the third signal comprises:

modifying the duty cycle of the first signal to the minimum pulse width if the duty cycle of the first signal is within the output voltage distortion range and greater than or equal to the first clipping value; and modifying the duty cycle of the first signal to the maximum pulse width if the duty cycle of the first signal is within the output voltage distortion range and less than or equal to the second clipping value.

3. A method according to claim 1, further comprising retaining the duty cycle of the first signal if the duty cycle is outside of the output voltage distortion range.

4. A method according to claim 1, further comprising:

selecting the first clipping value to be about a mid-point between the minimum achievable duty cycle and the minimum pulse width;

selecting the second clipping value to be about a mid-point between the maximum achievable duty cycle and the maximum pulse width.

5. A method according to claim 1, wherein the first, second, third, and fourth signals are discontinuous pulse width modulation (DPWM) signals.

6. A method according to claim 1, wherein the voltage source inverter has a first average output voltage associated with the output voltage distortion range between the minimum achievable duty cycle and the minimum pulse width and has a second average output voltage associated with the output voltage distortion range between the maximum pulse width and the maximum achievable duty cycle; and wherein the method further comprises:

maintaining the first average output voltage if the duty cycle of the first signal is greater than or equal to the minimum achievable duty cycle and the duty cycle of the first signal is less than the minimum pulse width; and maintaining the second average output voltage if the duty cycle of the first signal is greater than the maximum pulse width and the duty cycle of the first signal is less than or equal to the maximum achievable duty cycle.

7. A method according to claim 1, wherein the voltage source inverter comprises a switching circuit; and wherein the minimum and maximum pulse widths are based on preventing a short-circuit of the switching circuit.

8. A method for controlling a voltage source inverter having minimum and maximum pulse widths, a first distortion range less than the minimum pulse width, and a second distortion range greater than the maximum pulse width, the method comprising:

receiving a first signal having a duty cycle;

producing a first modified duty cycle configured to maintain a first average output voltage in the first distortion range if the duty cycle of the first signal is within the first distortion range;

producing a second modified duty cycle configured to maintain a second average output voltage in the second distortion range if the duty cycle of the first signal is within the second distortion range;

supplying a second signal to the voltage source inverter, the second signal comprising one of the first and second duty cycles.

9. A method according to claim 8, wherein the duty cycle has a range from a minimum achievable duty cycle to a maximum achievable duty cycle; and wherein said step of producing a first modified duty cycle comprises:

producing the first modifed duty cycle based on the minimum achievable duty cycle if the duty cycle of the first signal is within the first distortion range and less than a clipping value within the first distortion range; and producing the first modified duty cycle based on the minimum pulse width if the duty cycle of the first signal is within the first distortion range and greater than or equal to the clipping value.

10. A method according to claim 8, wherein the duty cycle of the first signal has a range from a minimum achievable duty cycle to a maximum achievable duty cycle; and wherein said step of producing a second modified duty cycle:

producing the second modified duty cycle based on the maximum pulse width if the duty cycle of the first signal is within the second distortion range and less than or equal to a clipping value within the second distortion range; and producing the second modified duty cycle based on the maximum achievable duty cycle if the duty cycle is within the second distortion range and greater than the clipping value.

11. A method according to claim 10, further comprising selecting the clipping value to be about a mid-point between the minimum achievable duty cycle and the minimum pulse width.

12. A method according to claim 8, wherein the duty cycle of the first signal has a range from a minimum achievable duty cycle to a maximum achievable duty cycle; and wherein said step of producing a first modified duty cycle:
  producing the first modified duty cycle based on the minimum achievable duty cycle if the duty cycle of the first signal is greater than or equal to the minimum achievable duty cycle and the duty cycle of the first signal is less than a clipping value, the clipping value within the first distortion range; and
  producing the first modified duty cycle based on the minimum pulse width if the duty cycle of the first signal is greater than or equal to the clipping value and the duty cycle of the first signal is less than the minimum pulse width.

13. A method according to claim 12, further comprising selecting the clipping value to be about a mid-point between the maximum pulse width and the maximum achievable duty cycle.

14. A method according to claim 8, wherein the duty cycle of the first signal has a range from a minimum achievable duty cycle to a maximum achievable duty cycle; and wherein said step of producing a second modified duty cycle:
  producing the second modified duty cycle based on the maximum pulse width if the duty cycle of the first signal is greater than the maximum pulse width and the duty cycle of the first signal is less than a clipping value, the clipping value within the second distortion range; and
  producing the second modified duty cycle based on the maximum achievable duty cycle if the duty cycle of the first signal is greater than the clipping value and the duty cycle of the first signal is less than or equal to the maximum achievable duty cycle.

15. A method according to claim 8, further comprising retaining the duty cycle of the first signal in the second signal if the duty cycle is outside of the first and second distortion ranges.

16. A method according to claim 8, wherein the first and second signals are discontinuous pulse width modulation (DPWM) signals.

17. A voltage source inverter for controlling an alternating current (AC) motor, the voltage source inverter having a distortion range and comprising:
  a controller having an input and an output, said controller configured to produce a first signal having a first duty cycle;
  a modulator having an input coupled to said output of said controller and having an output, said modulator configured to:
    produce a second duty cycle configured to maintain an average output voltage of the voltage source inverter if said first duty cycle is in the distortion range; and
    produce a second signal having said second duty cycle; and
  a switch network having an input coupled to said output of said modulator and having an output configured to be coupled to the ac motor, said switch network configured to produce an output voltage to the ac motor in response to said second signal.

18. A voltage source inverter according to claim 17, wherein said first duty cycle has a range from a minimum achievable duty cycle to a maximum achievable duty cycle; wherein said voltage source inverter has minimum and maximum pulse widths; and wherein said modulator is further configured to:
  produce said second duty cycle based on said minimum achievable duty cycle if said first duty cycle is greater than or equal to said minimum achievable duty cycle and said first duty cycle is less than a first clipping value, said first clipping value within the distortion region;
  produce said second duty cycle based on said minimum pulse width if said first duty cycle is greater than or equal to said first clipping value and said first duty cycle is less than said minimum pulse width;
  produce said second duty cycle based on said maximum pulse width if said first duty cycle is greater than said maximum pulse width and said first duty cycle is less than or equal to a second clipping value, said second clipping value greater than said first clipping value and within the distortion region; and
  produce said second duty cycle based on said maximum achievable duty cycle if said first duty cycle is greater than said second clipping value and said first duty cycle is less than or equal to said maximum achievable duty cycle.

19. A voltage source inverter according to claim 17, wherein said first clipping value is about a mid-point between said minimum achievable duty cycle and said minimum pulse width, and wherein said second clipping value is about a mid-point between said maximum pulse width and said maximum achievable duty cycle.

20. A voltage source inverter according to claim 17, wherein said first and second signals are discontinuous pulse width modulation signals.

* * * * *